(12) United States Patent
Pan

(10) Patent No.: US 8,437,724 B2
(45) Date of Patent: May 7, 2013

(54) METHOD AND SYSTEM FOR OUTPUT COMMON MODE CONTROL FOR REDUCING DC OFFSET FOR AN IF MIXER THAT DOWNCONVERTS A RECEIVED SIGNAL TO DC WITHOUT INTRODUCING ADDITIONAL OFFSET

(75) Inventor: Meng-An Pan, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 2498 days.

(21) Appl. No.: 10/977,874

(22) Filed: Oct. 29, 2004

(65) Prior Publication Data

US 2006/0094377 A1 May 4, 2006

(51) Int. Cl.
*H04B 1/10* (2006.01)
(52) U.S. Cl.
USPC .......................................... 455/296; 455/310
(58) Field of Classification Search ............... 455/127.1, 455/226.1, 230, 296, 310, 323, 334, 324, 455/325, 326, 284
See application file for complete search history.

(56) References Cited

U.S. PATENT DOCUMENTS

| | | | |
|---|---|---|---|
| 7,164,329 B2* | 1/2007 | Toncich et al. | 333/139 |
| 2005/0037723 A1* | 2/2005 | Khorram | 455/255 |
| 2005/0153676 A1* | 7/2005 | Ruelke et al. | 455/324 |
| 2006/0189283 A1* | 8/2006 | Tanaka et al. | 455/127.1 |

* cited by examiner

*Primary Examiner* — Blane J Jackson
(74) *Attorney, Agent, or Firm* — Thomas | Horstemeyer, LLP

(57) ABSTRACT

A method and system for output common mode control for reducing DC offset for an IF mixer that downconverts a received signal to DC without introducing additional offset is provided. Aspects of the method may comprise averaging signals having an output common mode DC level, which are generated from an output of the mixer. This determined average may then be compared to a reference voltage. The reference voltage may be an output common mode DC level required for baseband processing. The output common mode DC level may be corrected at an input of the mixer for signals that may subsequently be generated from an output of the mixer by utilizing results from the comparison. The corrected common mode DC offset level may be fed back to an input of the mixer.

16 Claims, 8 Drawing Sheets

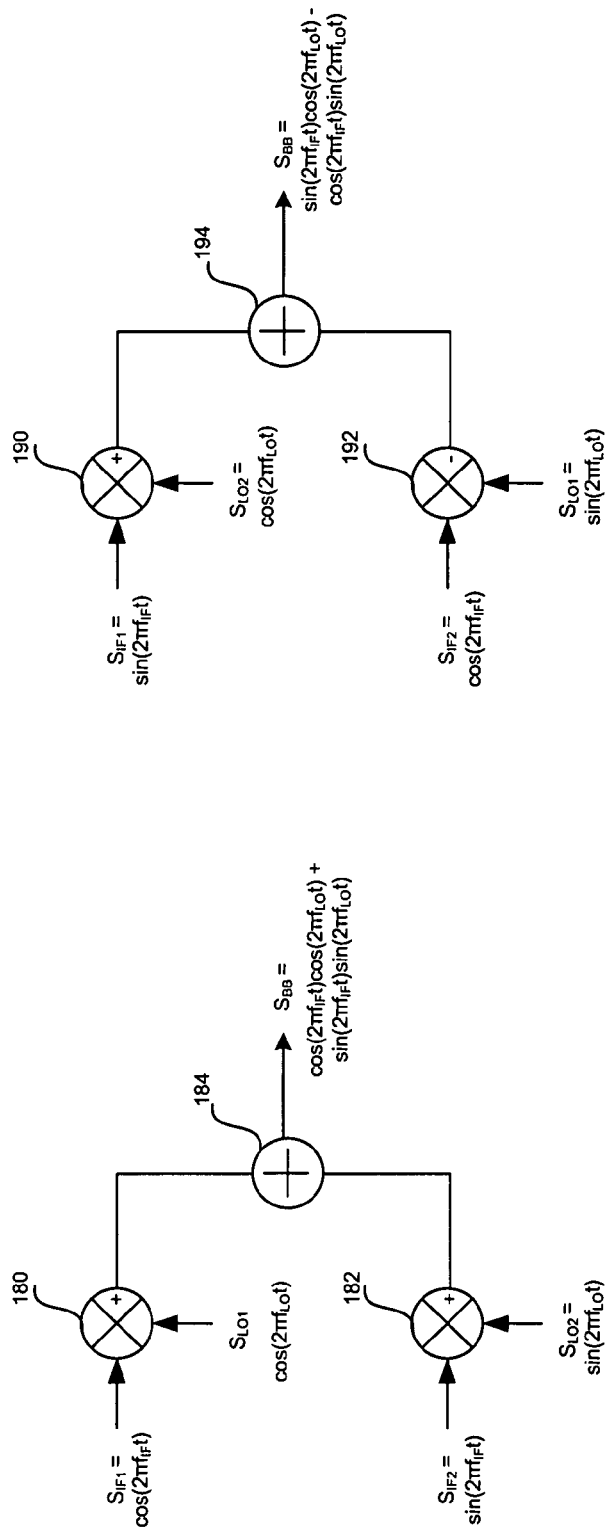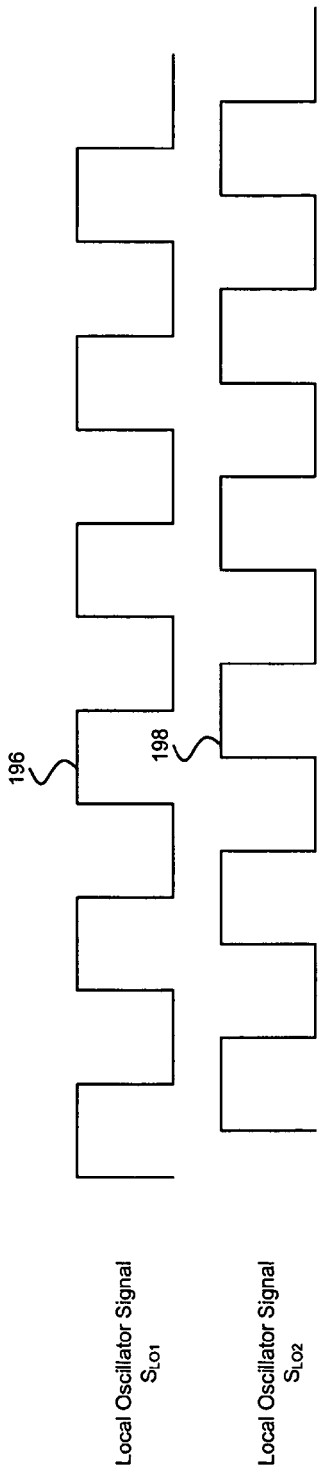

METHOD AND SYSTEM FOR OUTPUT COMMON MODE CONTROL FOR REDUCING DC OFFSET FOR AN IF MIXER THAT DOWNCONVERTS A RECEIVED SIGNAL TO DC WITHOUT INTRODUCING ADDITIONAL OFFSET

CROSS-REFERENCE TO RELATED APPLICATIONS/INCORPORATION BY REFERENCE

Related Applications

This application is related to the following applications, each of which is incorporated herein by reference in its entirety for all purposes:
U.S. patent application Ser. No. 10/976,976 filed Oct. 29, 2004;
U.S. patent application Ser. No. 10/976,977 filed Oct. 29, 2004;
U.S. patent application Ser. No. 10/977,000 filed Oct. 29, 2004;
U.S. patent application Ser. No. 10/976,575 filed Oct. 29, 2004;
U.S. patent application Ser. No. 10/977,464 filed Oct. 29, 2004;
U.S. patent application Ser. No. 10/977,798 filed Oct. 29, 2.004;
U.S. patent application Ser. No. 10/977,005 filed Oct. 29, 2004;
U.S. patent application Ser. No. 10/977,771 filed Oct. 29, 2004;
U.S. patent application Ser. No. 10/977,868 filed Oct. 29, 2004;
U.S. patent application Ser. No. 10/976,666 filed Oct. 29, 2004;
U.S. patent application Ser. No. 10/977,631 filed Oct. 29, 2004;
U.S. patent application Ser. No. 10/976,639 filed Oct. 29, 2004;
U.S. patent application Ser. No. 10/977,210 filed Oct. 29, 2004;
U.S. patent application Ser. No. 10/977,872 filed Oct. 29, 2004;
U.S. patent application Ser. No. 10/977,869 filed Oct. 29, 2004;
U.S. patent application Ser. No. 10/976,996 filed Oct. 29, 2004.

FIELD OF THE INVENTION

Certain embodiments of the invention relate to processing of RF signals. More specifically, certain embodiments of the invention relate to a method and system for output common mode control for reducing DC offset for a second IF mixer that downconverts a received signal to DC.

BACKGROUND OF THE INVENTION

In some conventional systems, an RF signal may be converted to an IF, and then from IF to a baseband signal where the IF may be in the megahertz range. Generally, the RF signal may be mixed with a local oscillator signal that may result in two sideband signals that may be the sum of the frequencies of the two signals and the difference of the frequencies of the two signals. One of the two sideband signals may be chosen as an IF signal, and this IF signal may be the same for all received RF signals. A radio that may receive a plurality of channels, such as an AM or FM radio, may tune to a particular station by changing the local oscillator signal frequency such that the IF remains constant. With a constant IF, most of the receive path may be common in the receiver. In some systems the signals, which are digitally processed in the receiver, are baseband signals. As such, the received IF signals must first be down converted to baseband.

Today, much of radio receiver development may be driven mostly by a great demand for mobile wireless communication devices, including handsets. With the ever-decreasing size of mobile handsets, capacities of smaller batteries may be an issue. As most of these handsets may use complementary metal-oxide semiconductor (CMOS) technology for analog to digital conversion, and for much of the processing of voice and data signals, a very important factor to consider is that it may be advantageous for CMOS devices to work at lower frequencies. This may be crucial since CMOS devices have power dissipation directly related to the speed at which the CMOS devices switch. The faster the frequencies, the faster the CMOS device switching speed, and therefore, the greater the amount of power consumed. The receivers may be designed to downconvert the high frequency RF, which may be in gigahertz range, to a lower frequency, preferably to a baseband frequency, as quickly as possible.

The process of downconversion of received signals from IF to baseband may have some drawbacks, such as DC-offset generation, interference noise, I/Q mismatch, excessive flicker noise in the baseband, and local oscillator (LO) leakage. In addition, a digital signal processor (DSP) may be required to perform complex digital processing of the digital signal for filtering and downconverting from the RF frequency. If a measured signal-to-noise ratio (SNR) is less than a desired SNR, the DSP may need to perform, for example, distortion cancellation or other SNR reduction or mitigation function. Additionally, during the process of IF to baseband downconversion, a signal path's intrinsic DC offsets may be amplified. The dynamic range of the circuit may thereby be degraded. In addition, a DC offset may be created if the LO signal leaks to the RF front end and self-mixes. Some systems, for example, Global Systems for Mobile communications (GSM) systems, may use modulation and system synchronization techniques that require DC information, therefore, it may not be feasible to simply remove the DC component. Once a signal is passed from the IF to baseband downconversion stage devices and systems which comprise later stages in the processing of the signal will be unable to distinguish the DC level which was contained in the originally received signal, from the DC offset that was introduced during IF to baseband downconversion.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for output common mode control for reducing DC offset for a second IF mixer that downconverts the received signal to DC without introducing additional offset. Aspects of the method may comprise averaging signals having an output common mode DC level, which are generated from an output of the mixer. This determined average may then be compared to a reference voltage. The reference voltage may be an output common mode DC level required for baseband processing. The output common mode DC level may be corrected at an input of the mixer for signals that may subsequently be generated from an output of the mixer by utilizing results from the comparison. The corrected common mode DC offset level may be fed back to an input of the mixer.

A corrected DC error signal may be generated from the comparison and the results from the comparison may comprise the corrected DC error signal. The corrected output common mode DC level may be communicated to at least one gm stage of the mixer. In this regard, the corrected output common mode DC level may be communicated to an I component path and/or Q component path of at least one gm stage of the mixer. The averaging of the signals having the output common mode DC level, which are generated from an output of the mixer may be determined for differential outputs of the mixer.

In another aspect of the invention, a current source may be controlled at a gm stage of the mixer utilizing at least an error signal from the comparison. An output common mode DC voltage at an output of the mixer may be corrected by controlling the current source. The method may also comprise continuously monitoring signals generated from the output of the mixer and correcting the signals having the output common mode DC level.

In another embodiment of the invention, a method for reducing DC offset in a receiver may comprise compensating for output common mode DC level at an input of a mixer rather than an output of the mixer. In this regard, a DC error correcting signal generated from an output of the mixer may be fed back to an input of the mixer, for example, and input gm stage of the mixer. The DC error correcting signal may be generated based on the output common mode DC level. The DC error correcting signal may be communicated to an I component path and/or a Q component path of the mixer.

Aspects of the system may comprise circuitry that averages signals having an output common mode DC level, which are generated from an output of the mixer. Circuitry may be provided that compares the determined average of the signals having the output common mode DC level to a reference voltage. The reference voltage may be an output common mode DC level required for baseband processing. Circuitry may be provided that corrects the output common mode DC level at an input of the mixer for signals that may subsequently be generated from an output of the mixer by utilizing results from the comparison. Feedback circuitry may be provided that is adapted to feedback the corrected common mode DC offset level to an input of the mixer. In this regard, correction is done at the input of the mixer rather than at an output of the mixer without introducing any additional DC offset.

Based on the comparison, circuitry may be adapted to generate a corrected DC error signal and the results from the comparison may comprise the corrected DC error signal. The corrected output common mode DC level may be communicated via circuitry to at least one gm stage of the mixer. In this regard, the corrected output common mode DC level may be communicated to an I component path and/or Q component path of at least one gm stage of the mixer. The circuitry that averages the signals having the output common mode DC level, which are generated from an output of the mixer, may be adapted to determine the average for differential outputs of the mixer.

In another aspect of the invention, circuitry may be utilized to control a current source at a gm stage of the mixer utilizing at least an error signal from the comparison. Circuitry may be adapted to correct an output common mode DC voltage at an output of the mixer by controlling the current source. The system may also comprise circuitry that is adapted to continuously monitor signals generated from the output of the mixer and correct the signals having the output common mode DC level.

In another embodiment of the invention, a system for reducing DC offset in a receiver may comprise circuitry that compensates for output common mode DC level at an input of a mixer rather than an output of the mixer. In this regard, circuitry may be provided for feeding back a DC error correcting signal generated from an output of the mixer to an input of the mixer, for example, and input gm stage of the mixer. Circuitry may be provided for generating the DC error correcting signal based on the output common mode DC level and the DC error correcting signal may be communicated to an I component path and/or a Q component path of the mixer.

These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 1E is a block diagram illustrating an exemplary single sideband mixing circuit, in accordance with an embodiment of the invention.

FIG. 1F is a block diagram illustrating an alternate exemplary single sideband mixing circuit, in accordance with an embodiment of the invention.

FIG. 1G is a timing diagram illustrating exemplary local oscillator signals out of phase by 90° with each other, in accordance with an embodiment of the invention.

DETAILED DESCRIPTION OF THE INVENTION

Certain embodiments of the invention may be found in a method and system for output common mode control for reducing DC offset for a second IF mixer that downconverts a received signal to DC without introducing additional DC offset. Various aspects of the invention may be utilized in a receiver, for example, a GSM receiver, which may be adapted to receive RF signals and down convert the received RF signals to an IF signal. The IF signal may be further down converted to a baseband signal. During the process of frequency downconversion on a signal within a system, it is possible for DC voltages to be introduced that were not intrinsic to the signal at the time that it was initially received by that system. These introduced DC voltages represent errors in the final baseband signal and may produce degradation in the SNR when information is subsequently extracted from the baseband signal. Some of the sources, which introduce DC voltages in the received signal, may be predicted in advance. In such cases, choices may be made during system design to compensate for the known DC offset error such that it does not degrade the SNR of the information content in the received signal. This, however, may depend upon the assumption that the characteristics of components in the system are consistently maintained at their nominal values that were specified during system design.

However, in systems comprising various components such as voltage sources, transistors and other active elements, and resistors and other passive elements, the characteristics of components within designed systems may deviate from nominal values. Some reasons that component characteristics may deviate from nominal values include variations in voltage levels supplied by voltage sources, manufacturing variations during component fabrication, and device characteristics, which may depend on temperature variations. Collectively, this may be referred to as process, voltage, temperature (PVT) variations. For example, in a battery powered system such as a wireless telephone, voltage levels may be highest when the battery is first installed or charged, and declines as the battery discharges. As a result, the actual common mode DC level in the received signal that is introduced during system operation may vary unpredictably and has to be brought back for further processing.

Figure 1A:
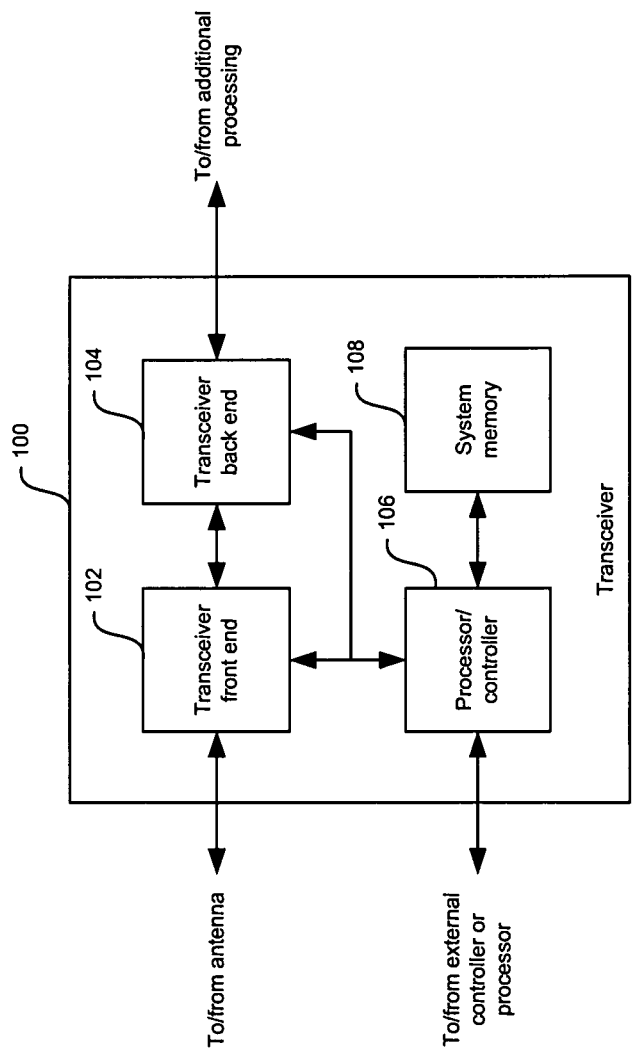
FIG. 1A is a block diagram of an exemplary radio frequency RF transceiver system, in accordance with an embodiment of the invention.

FIG. 1A is a block diagram of an exemplary RF transceiver system, in accordance with an embodiment of the invention. Referring to FIG. 1A, the RF transceiver system 100 may comprise a transceiver front end 102, a transceiver back end 104, a controller/processor 106, and a system memory 108. The transceiver front end 102 may comprise suitable logic, circuitry, and/or code that may be adapted to receive and/or transmit an RF signal. The transceiver front end 102 may comprise a receiver portion and a transmitter portion. Both the transmitter portion and the receiver portion may be coupled to an external antenna for signal broadcasting and signal reception respectively. The transceiver front end 102 may modulate a signal for transmission and may also demodulate a received signal before further processing of the received signal occurs. Moreover, the transceiver front end 102 may provide other functions, for example, digital-to-analog conversion, analog-to-digital conversion, frequency downsampling, frequency upsampling, and/or filtering. The transceiver front end 102 may provide a local oscillator frequency, which may be utilized for modulation and/or demodulation operations.

The transceiver back end 104 may comprise suitable logic, circuitry, and/or code that may be adapted to digitally process received signals from the transceiver front end 104 and/or to process signals received from at least one processing block, which may be located external to the RF transceiver system 100. The transceiver back end 104 may comprise, for example, a baseband processor. In this case, signals transferred from the transceiver front end 102 to the transceiver back end 104 may have been downconverted to a baseband frequency. The transceiver back end 104 may also comprise a signal interface that allows the transceiver front end 104 to transfer signals that have been downconverted to a low IF. In this case, a baseband processor in the transceiver back end 104 may process information after downconversion to the baseband frequency by the signal interface.

The controller/processor 106 may comprise suitable logic, circuitry, and/or code that may be adapted to control the operations of the transceiver front end 102 and/or the transceiver back end 104. For example, the controller/processor 106 may be utilized to update and/or modify programmable parameters and/or values in a plurality of components, devices, and/or processing elements in the transceiver front end 102 and/or in the transceiver back end 104. Control and/or data information may be transferred from at least one controller and/or processor external to the RF transceiver system 100 to the controller/processor 106 during the operation of the RF transceiver system 100. Moreover, the controller/processor 106 may also be adapted to transfer control and/or data information to at least one controller and/or processor external to the RF transceiver system 100.

The controller/processor 106 may be adapted to utilize the received control and/or data information to determine the mode of operation of the transceiver front end 102. For example, the controller/processor 106 may be adapted to select between a mode of operation where a received signal in the transceiver front end 102 may be down converted to a baseband frequency or a mode of operation where a received signal may be downconverted to a low IF. The system memory 108 may comprise suitable logic, circuitry, and/or code that may be adapted to store a plurality of control and/or data information.

Figure 1B:
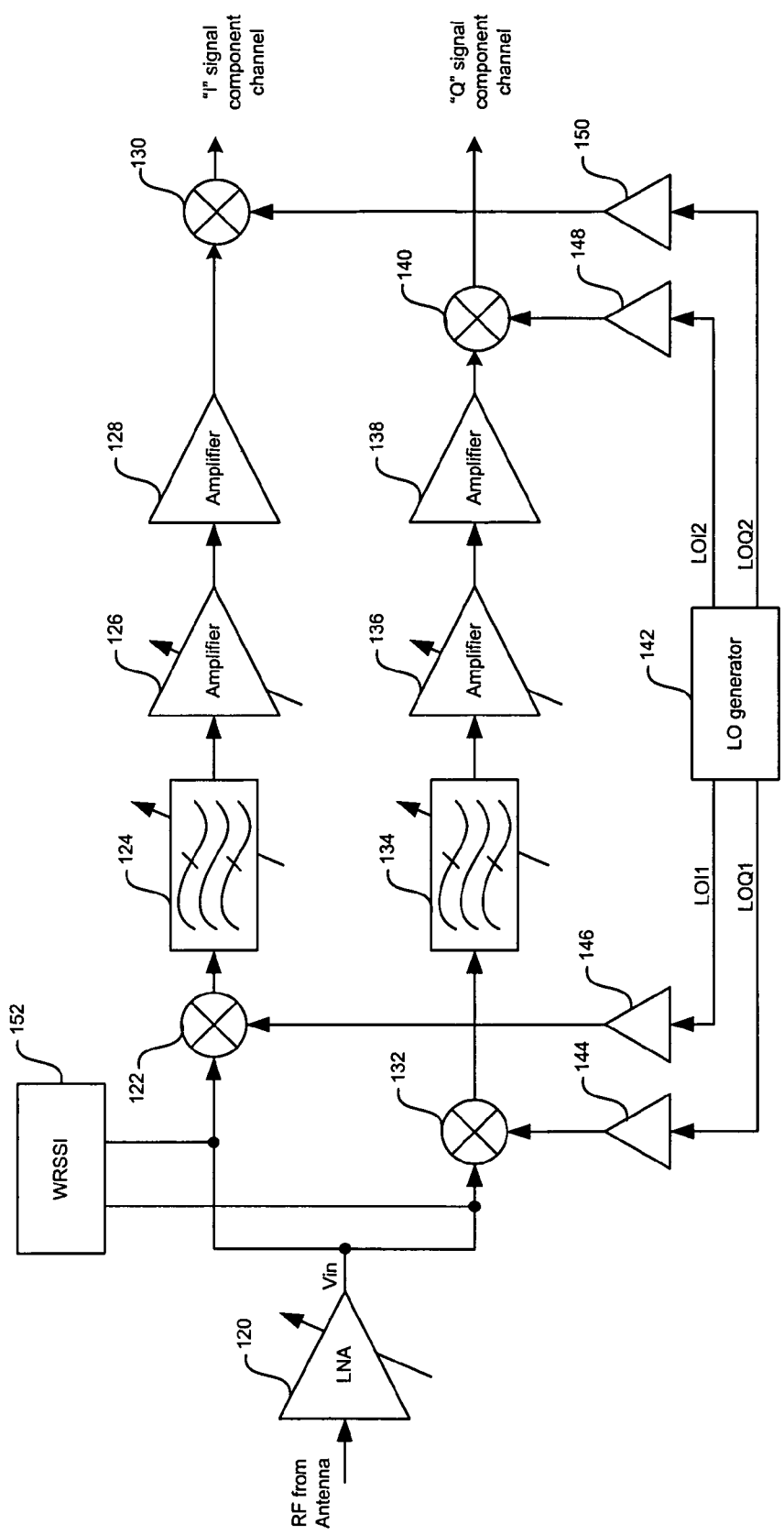
FIG. 1B is a block diagram of a receiver portion of a RF transceiver front end with dual mode mixers, in accordance with an embodiment of the invention.

FIG. 1B is a block diagram of a receiver portion of a RF transceiver front end with dual mode mixers, in accordance with an embodiment of the invention. Referring to FIG. 1B, there is shown a low noise amplifier (LNA) 120, mixers 122 and 132, bandpass filters 124 and 134, programmable gain amplifiers (PGA) 126 and 136, amplifiers 128 and 138, mixer blocks 130 and 140, a wideband receiver signal strength indicator (WRSSI) 152, buffers 144, 146, 148, and 150, and local oscillator (LO) generator 142. The LNA 120 may comprise suitable logic, circuitry, and/or code that may be adapted to amplify input signals and output the amplified signals. The LNA 120 may be utilized in instances where the signal to noise ratio (SNR) may be relatively low, such as, for example, RF signals received by an antenna. Certain aspects of the LNA 120 may be controllable and may be controlled by, for example, the processor/controller 106 in FIG. 1A. For example, the LNA 120 may be adapted to have a controllable gain. The WRSSI 152 may comprise suitable logic, circuitry, and/or code that may be adapted to determine the strength of the received signal. The WRSSI 152 may be adapted to generate a feedback control signal to the LNA 120 to modify the gain setting, for example.

The mixers 122 and 132 may comprise suitable logic, circuitry, and/or code that may be adapted to have as inputs two signals, and generate an output signal, which may be a difference of the frequencies of the two input signals and/or a sum of the frequencies of the two input signals. The mixers 122 and 132 may be adapted to down convert the received signal from an RF modulation frequency to an intermediate frequency (IF), for example. The mixers 122 and 132 may be adapted to utilize the local oscillator signals LOI1 and LOQ1, respectively. In this regard, the LOI1 and LOQ1 signals may comprise a plurality of signals.

The bandpass filters 124 and 134 may comprise suitable logic, circuitry, and/or code that may be adapted to selectively pass signals within a certain bandwidth while attenuating signals outside that bandwidth. The bandpass filters 124 and 134 may further comprise an amplifier circuit that may amplify the bandpass filtered signal, and the gain of the amplifier circuit may be controlled by, for example, the transceiver back end 104 or the processor/controller 106 in FIG. 1A.

The PGAs 126 and 136 may comprise suitable logic, circuitry, and/or code that may be adapted to amplify input signals and output the amplified signals. Certain aspects of the PGAs 126 and 136 may be controllable. The gain of the PGAs 126 and 136 may be controllable and may be controlled by, for example, the transceiver back end 104 or the processor/controller 106 in FIG. 1A. The gain of the PGAs 126 and 136 may be as high as, for example, 30 dB. The amplifiers 128 and 138 may comprise suitable logic, circuitry, and/or code that may be adapted to amplify input signals and output the amplified signals. The amplifiers 128 and 138 may be fixed gain amplifiers, and the gain may be fixed, for example, at 15 dB.

The mixer blocks 130 and 140 may comprise suitable logic, circuitry, and/or code that may be adapted to mix an input signal with a local oscillator input signal to produce an output signal that may be a difference of the frequencies of the two input signals and/or a sum of the frequencies of the two input signals. The mixer blocks 130 and 140 may be adapted to select between a low intermediate frequency (IF) mode or a baseband frequency mode. In this regard, the mixer blocks 130 and 140 may be said to be dual mode mixer blocks, for example. When the low intermediate frequency (IF) mode is selected, the mixer blocks 130 and 140 may pass through the input signal without performing a downconversion. When the baseband frequency mode is selected, the mixer blocks 130 and 140 may down convert the input signal to zero frequency or baseband at the output. Moreover, the mixer blocks 130 and 140 may reduce noise around a desired bandwidth of the output signal by utilizing phase shifted input signals and phase shifted local oscillator signals.

The local oscillator (LO) generator 142 may comprise suitable logic, circuitry, and/or code that may be adapted to generate local oscillator signals that may be utilized by the mixers 122 and 132 and the mixer blocks 130 and 140. In this regard, the LO generator 142 may generate a plurality of signals. While the LO generator 142 in FIG. 1B is shown to generate the signals LOI1, LOI2, LOQ1, and LOQ2, it may not be so limited. The LO generator 142 may generate local oscillator signals LOI1 and LOQ1 of a plurality of frequencies and/or at different phase values relative to each other. The LO generator 142 may generate local oscillator signals LOI2 and LOQ2 of a plurality of frequencies and/or at different phase values relative to each other. In this regard, the operation and output signals generated by the LO generator 142 may be controllable and may be controlled by, for example, the transceiver back end 104 or the processor/controller 106 in FIG. 1A. The buffers 144, 146, 148, and 150 may comprise suitable logic, circuitry, and/or code that may be adapted to buffer the local oscillator signals before being communicated or transferred to the corresponding frequency mixers.

In operation, the RF signal, which may have a carrier frequency referred to as $\omega_0$, may be received by an antenna and communicated to the LNA 120, where the RF signal may be amplified by the LNA 120. The amplified RF signal may be communicated to an input of the mixers 122 and 132. The mixers 122 and 132 may mix this amplified signal with local oscillator signals LOI1 and LOQ1, respectively. The outputs of the mixers 122 and 132 may be intermediate frequency (IF) "I" and "Q" signal components, respectively. The intermediate frequency may be, for example, 100 KHz.

The IF "I" and "Q" signal components may be communicated to bandpass filters 124 and 134, which may be adapted to pass the desired bandwidth of signals about the IF frequency, while attenuating the undesired frequencies in the IF signal, and may also amplify the desired bandwidth of signals. The filtered and amplified IF "I" and "Q" signal components may be communicated to PGAs 126 and 136, and these signals may be amplified. The current gain of the PGAs 126 and 136 may be controlled by, for example, the transceiver back end 104 or the processor/controller 106 in FIG. 1A. The amplified output signals IF "I" and IF "Q" from the PGAs 126 and 136 may be communicated to the amplifiers 128 and 138. At the amplifiers 128 and 138, IF "I" and "Q" signal components may be further amplified. The IF "I" signal component at the output of the amplifier 128 may be communicated to at least the input of the mixer block 130 and the IF "Q" signal component at the output of the amplifier 138 may be communicated to at least the input of the mixer block 140.

The mixer blocks 130 and 140 may be configured to either pass through the IF "I" and "Q" signal components at the low IF or may be configured to down convert the IF "I" and "Q" signal components to "I" and "Q" baseband signals respectively. The local oscillator signals LOI2 and LOQ2 may be utilized as control signals to configure the operation of the mixer blocks 130 and 140. When the IF "I" and "Q" signal components are passed through, they may be transferred to a circuit, device, and/or component that comprises an IF interface. When the "I" and "Q" baseband signals are generated by downconversion at the mixer blocks 130 and 140, they may be transferred to a circuit, device, and/or component that comprises a baseband interface.

Figure 1C:
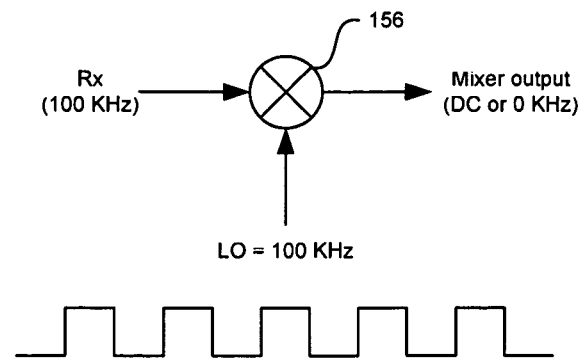
FIG. 1C illustrates an exemplary baseband downconversion operation in a dual mode mixer, in accordance with an embodiment of the invention.

FIG. 1C illustrates an exemplary baseband downconversion operation in a dual mode mixer, in accordance with an embodiment of the invention. Referring to FIG. 1C, when the mode of operation selected is a baseband downconversion mode, a dual mode mixer block 156 may be utilized in a baseband downconversion configuration. The dual mode mixer block 156 may comprise suitable logic, circuitry, and/or code that may be adapted to generate a mixer output signal at baseband from an IF input signal and a IF local oscillator signal when the baseband downconversion mode is selected. In this case, the intermediate frequency may be 100 KHz, for example, and the baseband frequency refers to 0 KHz or DC frequency. The local oscillator frequency may be a differential signal and/or may be a square wave.

Figure 1D:
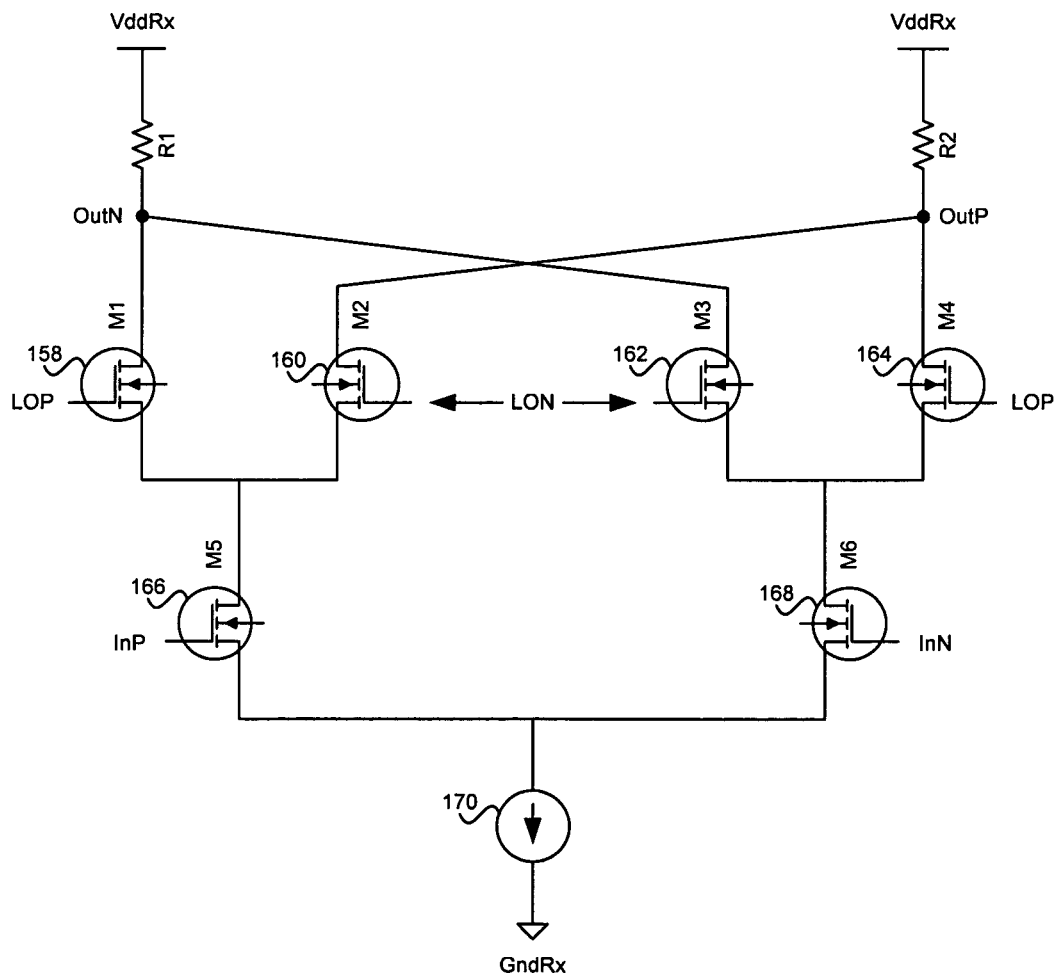
FIG. 1D is a circuit diagram of an exemplary dual mode mixer in a baseband downconversion configuration, in accordance with an embodiment of the invention.

FIG. 1D is a circuit diagram of an exemplary dual mode mixer in a baseband downconversion configuration, in accordance with an embodiment of the invention. Referring to FIG. 1D, the dual mode mixer block 156 in FIG. 1C may be implemented utilizing the exemplary circuit shown. The dual mode mixer block 156 may comprise a first NMOS transistor (M1) 158, a second NMOS transistor (M2) 160, a third NMOS transistor (M3) 162, a fourth NMOS transistor (M4) 164, a fifth NMOS transistor (M5) 166, a sixth NMOS transistor (M6) 168, resistors R1 and R2, and a current source 170. The implementation described in FIG. 1E may be referred to as a Gilbert cell.

Transistors M1 158, M2 160, M3 162, and M4 164 may be utilized to perform the frequency mixing operation in the dual mode mixer block 156. Transistors M5 166 and M6 168 may be utilized to provide a differential input gain based on the value of the current source 170. Resistors R1 and R2 may be utilized to provide load between the drains of the frequency mixing transistors and the supply voltage (VddRx).

In operation, when the mode of operation is the baseband downconversion mode, a positive signal of the local oscillator differential pair (LOP) may be applied to the gate of M1 158 and to the gate of M4 164, while a negative signal of the local oscillator differential pair (LON) may be applied to the gate of M2 160 and to the gate of M3 162. The positive signal of the IF signal component differential pair may be applied to the gate of M5 166 and the negative signal of the IF signal component differential pair may be applied to the gate of M6 168. In this configuration, the differential output generated at the nodes OutN and OutP may be a baseband frequency signal produced from the modulated IF differential pair and the IF local oscillator differential pair.

While the dual mode mixer block 156 as described in FIG. 1D comprises NMOS transistors and is implemented utilizing a single gain stage and a single mixing stage, the dual mode mixer block 156 may also be designed utilizing PMOS and/or CMOS devices and may also be implemented utilizing a plurality of gain and/or mixing stages.

FIG. 1E is a block diagram illustrating an exemplary single sideband mixing circuit, in accordance with an embodiment of the invention. Referring to FIG. 1E, there is shown two mixers 180 and 182 that may comprise suitable logic, circuitry and/or code that may be adapted mix two input signals and generate an output signal that may comprise frequencies that may be represented as a sum and a difference of frequencies of the two signals.

An IF signal $S_{IF1}$ may be communicated to a first of the two inputs of the mixer 180, and a local oscillator (LO) signal $S_{LO1}$ may be communicated to a second of the two inputs of the mixer 180. An IF signal $S_{IF2}$ that may be 90° out of phase with the IF signal $S_{IF1}$ may be communicated to a first of the two inputs of the mixer 182, and a local oscillator (LO) signal $S_{LO2}$ that may be 90° out of phase with the local oscillator (LO) signal $S_{LO1}$ may be communicated to a second of the two inputs of the mixer 182. The outputs of the mixers 180 and 182 may be coupled and added together by the adder block 184 to generate the output signal $S_{BB}$, in which an output baseband signal $S_{BB}$ may be the desired component.

The IF signals $S_{IF1}$ and $S_{IF2}$ and the LO signals $S_{LO1}$ and $S_{LO2}$ may be represented by using sine and cosine notations to represent the two signals, and mixing the two signals may be represented by multiplying the two signals. Therefore, the IF signal $S_{IF1}$ may be represented as $$S_{IF1}=\cos(2\pi f_{IF}t)$$

and since the IF signal $S_{IF2}$ may be 90° (or π/2 radians) out of phase with the IF signal $S_{IF1}$, the IF signal may be represented as $$S_{IF2}=\cos(2\pi f_{IF}t-\pi/2)=\sin(2\pi f_{IF}t).$$

Similarly, the LO signals $S_{LO1}$ and $S_{LO2}$ may be represented as $$S_{LO1}=\cos(2\pi f_{LO}t)$$

$$S_{LO2}=\cos(2\pi f_{LO}t-\pi/2)=\sin(2\pi f_{LO}t).$$

The output signals of the mixers 180 and 182 may then be represented as $\cos(2\pi f_{IF}t)\cos(2\pi f_{LO}t)$ and $\sin(2\pi f_{IF}t)\sin(2\pi f_{LO}t)$, respectively. Therefore, the output of the mixer 180 added to the output of the mixer 182 may be represented as $$S_{BB}=\cos(2\pi f_{IF}t)\cos(2\pi f_{LO}t)+\sin(2\pi f_{IF}t)\sin(2\pi f_{LO}t)=\cos(2\pi(f_{IF}-f_{LO})t)$$

The IF signals $S_{IF1}$ and $S_{IF2}$ may comprise a plurality of frequencies including a base frequency $f_{IF}$ and interfering signals at various frequencies, for example, $3f_{IF}$, $5f_{IF}$, $7f_{IF}$, $9f_{IF}$, $17f_{IF}$, $31f_{IF}$. The LO signals $S_{LO1}$, and $S_{LO1}$ may also comprise a plurality of frequencies, for example, a base frequency $f_{IF}$ and odd harmonics of the base frequency $f_{IF}$. For the base frequency of $f_{IF}$, the third harmonic frequency may be $3f_{IF}$, the fifth harmonic frequency may be $5f_{IF}$, the seventh harmonic frequency may be $7f_{IF}$, etc. Therefore, the output signal $S_{BB}$ may comprise a plurality of frequencies due to mixing of each frequency of the IF signal $S_{IF}$ with each frequency of the LO signal $S_{LO}$, in which a DC baseband signal of the output signal $S_{BB}'$ may be desired to be further processed.

Since mixing of the IF signal $S_{IF}$ with the base frequency $f_{IF}$ of the LO signal $S_{LO}$ may be represented as $S_{BB}=\cos(2\pi(f_{IF}-f_{LO})t)$, the frequencies generated may be $f_{IF}-f_{IF}=0$ or DC, $4f_{IF}$, $6f_{IF}$, etc. However, when the harmonics of the LO signal $S_{LO}$ are considered, the additional phase differences must be taken in to account. Since the frequency of the third harmonic of the LO signal $S_{LO}$ is tripled, the phase difference of the third harmonic is also tripled with respect to the base frequency of the LO signal $S_{LO}$. Therefore, the third harmonic may be described by $$\sin(2\pi(3f_{IF}t)+\pi)=-\sin(2\pi(3f_{IF}t)).$$

The addition of π, which is equivalent to 180°, is because the third harmonic has a phase difference of 270° versus the phase difference of 90° for the base frequency. The third harmonic has an extra phase difference of 180°. Therefore, the equation describing the sum of the outputs of the two mixers may then be $$S_{BB}=\cos(2\pi f_{IF}t)\cos(2\pi f_{LO}t)-\sin(2\pi f_{IF}t)\sin(2\pi f_{LO}t)=\cos(2\pi(f_{IF}+f_{LO})t)$$

The frequencies generated due to the third harmonic of the LO signal $S_{LO}$ may be a sum of the two frequencies of the IF signal $S_{IF}$ and the LO signal $S_{LO}$. Similarly, the fifth harmonic of the LO signal $S_{LO}$ may be subtracted from the frequencies of the IF signal $S_{IF}$, the seventh harmonic of the LO signal $S_{LO}$ may be added to the frequencies of the IF signal $S_{IF}$, etc.

Therefore, the IF signal $S_{IF}$ mixed with the harmonic frequencies ($1f_{IF}$, $3f_{IF}$, $5f_{IF}$, $7f_{IF}$ ...) of the LO signal $S_{LO}$ may be DC, $4f_{IF}$, $-4f_{IF}$, $8f_{IF}$, etc. The interference/blocker at signal $3*S_{IF}$ mixed with the harmonic frequencies ($1f_{IF}$, $3f_{IF}$, $5f_{IF}$, $7f_{IF}$ ...) of the LO signal $S_{LO}$ may be $2f_{IF}$, $6f_{IF}$, $-2f_{IF}$, $10f_{IF}$ etc. The interference/blocker at signal $5*S_{IF}$ mixed with the harmonic frequencies ($1f_{IF}$, $3f_{IF}$, $5f_{IF}$, $7f_{IF}$ ...) of the LO signal $S_{LO}$ may be $4f_{IF}$, $8f_{IF}$, DC, $12f_{IF}$ etc. Accordingly, where there may be at least one DC component in the output signal $S_{BB}$ from each odd harmonic of the LO signal $S_{LO}$ in the single mixer implementation, only every other odd harmonic of the LO signal $S_{LO}$ may contribute a DC component to the output signal $S_{BB}$. Therefore, the interfering components at the DC baseband that may distort the information in the output baseband signal $S_{BB}'$ may have been reduced by half.

FIG. 1F is a block diagram illustrating an alternate exemplary single sideband mixing circuit, in accordance with an embodiment of the invention. Referring to FIG. 1F, there is shown two mixers 190 and 192 that may comprise suitable logic, circuitry and/or code that may be adapted mix two input signals and output a signal that may comprise frequencies that may be represented as a sum and a difference of frequencies of the two signals.

An IF signal $S_{IF1}$ may be communicated to a first of the two inputs of the mixer 190, and a local oscillator (LO) signal $S_{LO1}$ may be communicated to a second of the two inputs of the mixer 190. An IF signal $S_{IF2}$ that may be 90° out of phase with the IF signal $S_{IF1}$ may be communicated to a first of the two inputs of the mixer 192, and a local oscillator (LO) signal $S_{LO2}$ that may be 90° out of phase with the local oscillator (LO) signal $S_{LO1}$ may be communicated to a second of the two inputs of the mixer 192. The outputs of the mixers 190 and 192 may be coupled and added together by the adder block 194 to form the output signal $S_{BB}$, in which an output baseband signal $S_{BB}'$ may be the desired component.

The IF signals $S_{IF1}$ and $S_{IF2}$ and the LO signals $S_{LO1}$ and $S_{LO2}$ may be represented by using sine and cosine notations to represent the two signals, and mixing the two signals may be represented by multiplying the two signals. As an alternative to FIG. 1E, however, the IF signal $S_{IF1}$ may be represented by a sine function $$S_{IF1} = \sin(2\pi f_{IF} t)$$

and since the IF signal $S_{IF2}$ may be 90° (or $\pi/2$ radians) out of phase with the IF signal $S_{IF1}$, the IF signal may be represented as $$S_{IF2} = \sin(2\pi f_{IF} t + \pi/2) = \cos(2\pi f_{IF} t).$$

The LO signals $S_{LO1}$ and $S_{LO2}$ may be represented as in FIG. 1E $$S_{LO1} = \cos(2\pi f_{LO} t)$$

$$S_{LO2} = \cos(2\pi f_{LO} t - \pi/2) = \sin(2\pi f_{LO} t).$$

The outputs of the mixers 190 and 192 may then be $\sin(2\pi f_{IF} t)\cos(2\pi f_{LO} t)$ and $\cos(2\pi f_{IF} t)\sin(2\pi f_{LO} t)$, respectively. Therefore, the output of the mixer 190 may be added to the negative output of the mixer 192 and the result may be represented as $$S_{BB} = \sin(2\pi f_{IF} t)\cos(2\pi f_{LO} t) - \cos(2\pi f_{IF} t)\sin(2\pi f_{LO} t) = \sin(2\pi (f_{IF} - f_{LO}) t)$$

When the positive output of the mixer 190 is added to the negative output of the mixer 192, the result may be that only one sideband is generated, rather than two sidebands that are generated from the output of one mixer. Therefore, similarly as illustrated in FIG. 1F, only every other odd harmonic of the LO signal $S_{LO}$ may contribute a DC component to the output signal $S_{BB}$. This may result in the number of interfering components at the DC baseband, which may distort the information in the output baseband signal $S_{BB}'$, being reduced by half.

When the positive output of the mixer 190 is added to the negative output of the mixer 192, the result may be that only one sideband is generated, rather than two sidebands that are generated from the output of one mixer. Therefore, similarly as illustrated in FIG. 1F, only every other odd harmonic of the LO signal $S_{LO}$ may contribute a DC component to the output signal $S_{BB}$. This may result in the number of interfering components at the DC baseband, which may distort the information in the output baseband signal $S_{BB}'$, being reduced by half.

FIG. 1G is a timing diagram illustrating exemplary local oscillator signals out of phase by 90° with each other, in accordance with an embodiment of the invention. Referring to FIG. 1G, there is shown local oscillator (LO) signals $S_{LO1}$ 196 and $S_{LO2}$ 198. LO signal $S_{LO1}$ 196 may be a waveform in which there may be two states—a high state and a low state. The high state may represent logic 1 and the low state may represent logic 0, for example. The LO signal $S_{LO2}$ 198 may be 90° out of phase with respect to the LO signal $S_{LO1}$ 196. One method of generating the LO signal $S_{LO2}$ 198 may comprise delaying the LO signal $S_{LO1}$ 196 by one clock cycle, for example, by utilizing a flip-flop, in which the clock signal to the flip-flop may have a frequency that may be four times the frequency of the LO signal $S_{LO1}$ 196.

Figure 2:
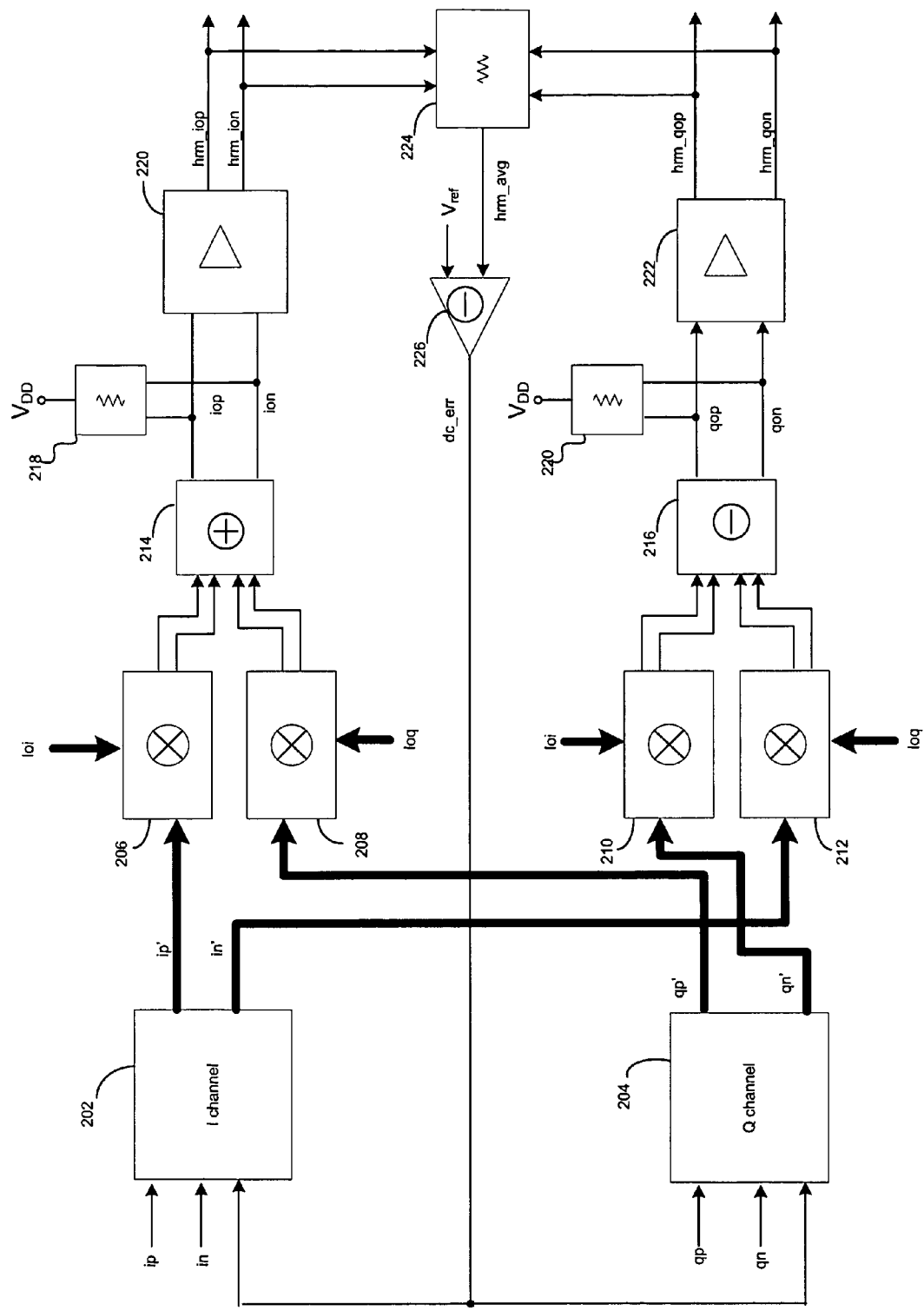
FIG. 2 is a block diagram of an exemplary IF to baseband down converter system, in accordance with an embodiment of the invention.

FIG. 2 is a block diagram of a receiver portion illustrating a plurality of single sideband mixing circuits, in accordance with an embodiment of the invention. Referring to FIG. 2, there is shown an I component gm stage 202, a Q component gm stage 204, a plurality of I component mixer circuits 206 and 212, a plurality of Q component mixer circuits 208 and 210, a plurality of adder blocks 214 and 216, impedance load blocks 218 and 220, output buffer blocks 220 and 222, a signal averaging block 224, and a signal comparator 226.

The I component gm stage 202 may comprise suitable logic and/or circuitry that may be adapted to receive a plurality of input signals ip and in from the output of amplifier 128 (FIG. 1B) and generate a plurality of output signals to a plurality of I component mixer circuits 206 and 212. The Q component gm stage 204 may comprise suitable logic and/or circuitry that may be adapted to receive a plurality of input signals qp and qn from the output of amplifier 138 (FIG. 1B) and generate a plurality of output signals to a plurality of Q component mixer circuits 208 and 210.

The I component mixer circuit 206 may comprise suitable logic and/or circuitry that may be adapted to mix a plurality of input signals received from the I component gm stage 202 and a plurality of polyphase local oscillator clock signals loi and generate a plurality of output signals op and on to the adder block 214. The Q component mixer circuit 208 may comprise suitable logic and/or circuitry that may be adapted to mix a plurality of input signals received from the Q component gm stage 204 and a plurality of polyphase local oscillator clock signals loq and generate a plurality of output signals op and on to the adder block 214.

The I component mixer circuit 212 may comprise suitable logic and/or circuitry that may be adapted to mix a plurality of input signals received from the I component gm stage 202 and a plurality of polyphase local oscillator clock signals loq and generate a plurality of output signals op and on to the adder block 216. The Q component mixer circuit 210 may comprise suitable logic and/or circuitry that may be adapted to mix a plurality of input signals received from the Q component gm stage 204 and a plurality of polyphase local oscillator clock signals loi and generate a plurality of output signals op and on to the adder block 216.

The adder block 214 may comprise suitable logic and/or circuitry that may be adapted to add a plurality of input signals received from the I component mixer circuit 206 and the Q component mixer circuit 208 and generate a plurality of output signals iop and ion that may be an output DC signal of the I channel. The adder block 216 may comprise suitable logic and/or circuitry that may be adapted to subtract a plurality of input signals received from the I component mixer circuit 212 and the Q component mixer circuit 210 and generate a plurality of output signals qop and qon that may be an output comprising a difference signal of the Q channel.

Figure 2B:
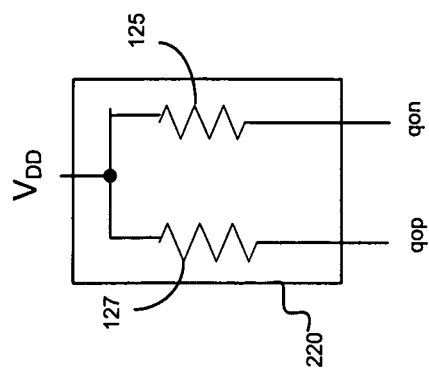
FIG. 2B is an exemplary impedance load network block of FIG. 2 that may be utilized in connection with an embodiment of the invention.
Figure 2A:
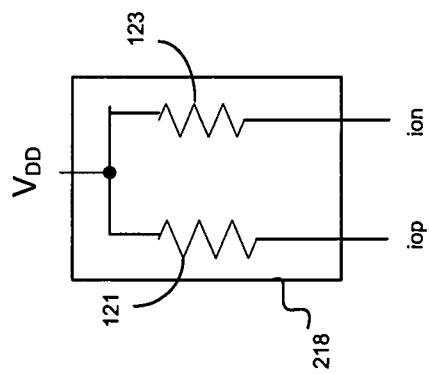
FIG. 2A is an exemplary impedance load network block of FIG. 2 that may be utilized in connection with an embodiment of the invention.

The impedance load network block 218 may be coupled to the system supply voltage, $V_{DD}$ (FIG. 2), and sets bias voltages at output iop. FIG. 2A is an exemplary impedance load network block of FIG. 2 that may be utilized in connection with an embodiment of the invention. Referring to FIG. 2A, there is shown the impedance load network block 218, implemented as resistor 121 and resistor 123. In this implementation, resistor 121 may be utilized to set a bias level at signal iop, while resistor 123 sets the bias level at signal ion. FIG. 2B is an exemplary impedance load network block of FIG. 2 that may be utilized in connection with an embodiment of the invention. Referring to FIG. 2B, there is shown the impedance load network block 220 implemented as resistor 127 and resistor 125. In this implementation, resistor 127 sets the bias level at signal qop, while resistor 125 sets the bias level at signal qon.

The output blocks 220 and 222 may each comprise suitable logic and/or circuitry that may be coupled to pads, which and may be adapted to drive circuits that may be external to a chip.

The output buffer block 220 may be coupled to an output of adder block 214. In this regard, buffer block 220 may be coupled to outputs iop and ion of the adder block 214. The output buffer block 222 may be coupled to an output of adder block 216. In this regard, buffer block 222 may be coupled to outputs qop and qon of the adder block 214. The output buffer blocks 220, 222 may both be coupled to the signal averaging block 224 and may be adapted to generate output signals hrm_iop, hrm_ion, hrm_qop, and hrm_qon, respectively.

The signal averaging block 224 may comprise suitable logic and/or circuitry that may be adapted to receive as input a plurality of baseband signals and generate at least one output signal from the received inputs. For example, the signal averaging block 224 may be adapted to receive as input, each of the output baseband signals hrm_iop, hrm_ion, hrm_qop, and hrm_qon, and generate an output signal, hrm_avg, which is the average voltage level among the inputs. In one aspect of the invention, the signal averaging block 224 may be implemented utilizing a network of resistors.

The signal comparator 226 may comprise suitable logic and/or circuitry that may be adapted to receive a input signal, hrm_avg, and an external voltage reference signal $V_{REF}$, and generate a DC offset error signal, dc_err. The signal comparator 226 may be adapted to produce and output signal error, dc_err, which may be equivalent to ($V_{REF}$–hrm_avg). The output DC offset error signal, dc_err, generated from the signal comparator 150 may be fed back as an input signal to a gm stage in both the I channel 102 and the Q channel 104.

In operation, the I component gm stage 202 and the Q component gm stage 204 may be adapted to receive the input signals ip and in from the output of the amplifier 128 [FIG. 1B] and qp and qn from the output of amplifier 138 [FIG. 1B] respectively and generate a plurality of output signals to the plurality of I component mixer circuits 206 and 212 and a plurality of Q component mixer circuits 208 and 210. The I component mixer circuits 206 and 212 and Q component mixer circuits 208 and 210 may be adapted to mix the plurality of input signals received from the I component gm stage 202 and the Q component gm stage 204 with a plurality of polyphase local oscillator clock signals loi and loq. A plurality of output signals op and on may be generated and communicated to the adder blocks 214 and 216. The adder blocks 214 and 216 may be adapted to add a plurality of input signals received from the I component mixer circuit 206 and the Q component mixer circuit 208 and subtract a plurality of input signals received from the I component mixer circuit 212 and the Q component mixer circuit 210 respectively. Accordingly, a plurality of output signals iop and ion that may be generated and communicated as an output differential DC signal for the I channel. A plurality of output signals qop and qon that may also be generated as a differential output comprising a difference signal of the Q channel respectively.

Internal baseband signal iop generated form the adder block 214 may be communicated as an input to output buffer 220, which is used to generate an output baseband signal hrm_iop. The output buffer 220 may also be adapted to receive an internal baseband signal ion and accordingly, generate output a baseband signal hrm_ion. The output buffer 222 may be adapted to receive internal baseband signals qop and qon and accordingly, generate output baseband signals hrm_qop and hrm_qon respectively.

One aspect of the invention may comprise detecting when output common mode DC level have been introduced into received IF signals that are the result of deviations in component characteristics, for example, PVT variations. Subsequent to detecting the DC offset voltage errors, a value of the DC offset error may be determined and a correction signal may be generated and fed back via a feedback path to the input(s) of the system. The system may be adapted to modify its bias voltages based on the error correction signal, so as to reduce any introduced DC offset error.

Figure 3:
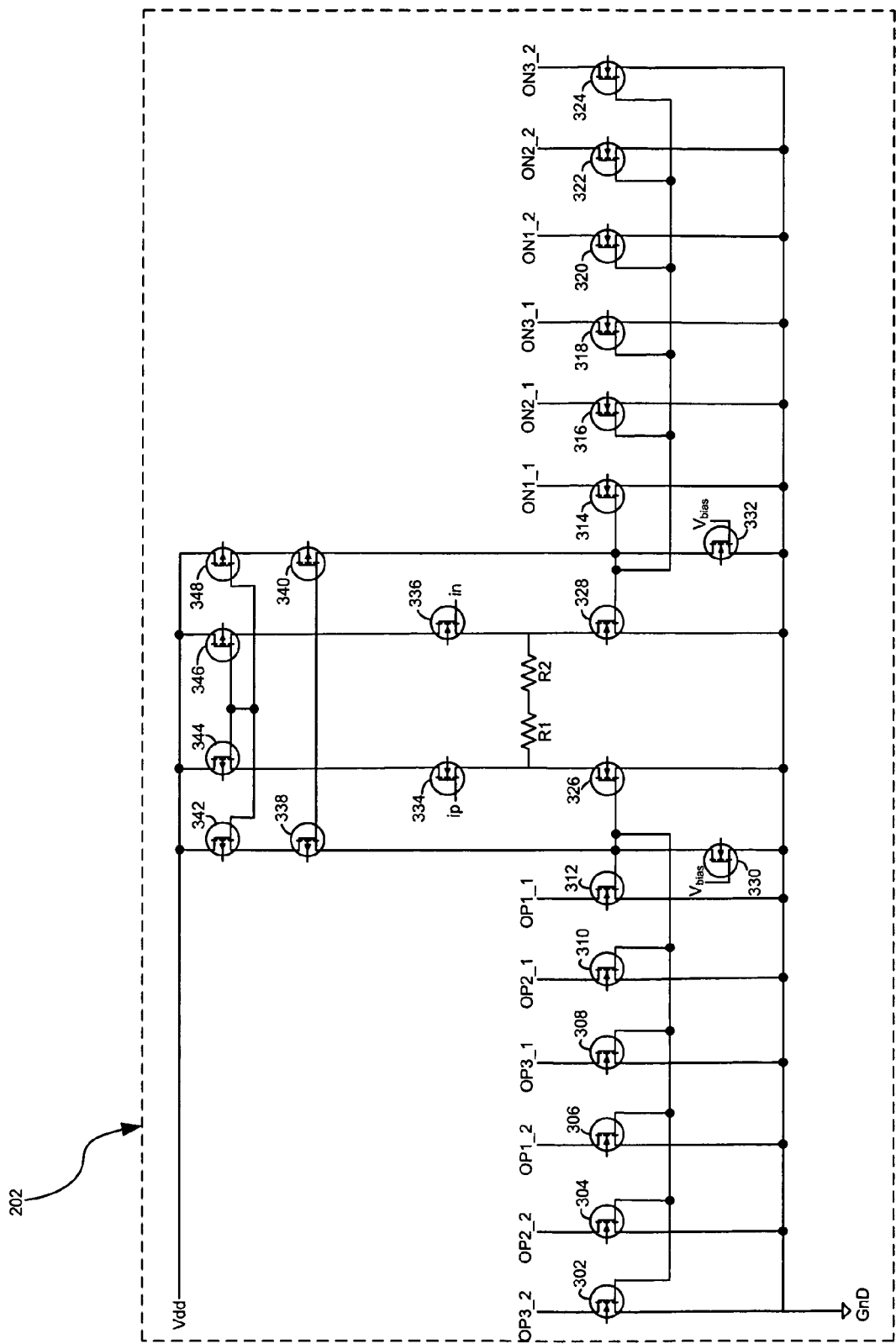
FIG. 3 is a circuit diagram of an exemplary I component gm stage of the circuit of FIG. 2, in accordance with an embodiment of the invention.

FIG. 3 is a circuit diagram of an exemplary I component Gm stage, in accordance with an embodiment of the invention. Referring to FIG. 3, there is shown the I component Gm stage 202 that comprises a plurality of NMOS transistors 302, 304, 306, 308, 310, 312, 314, 316, 318, 320, 322, 324, 326, 328, 330, 332, 334, 336, 338, 340, 342, 344, 346 and 348 and resistors R1 and R2.

The gates of the plurality of NMOS transistors 302, 304, 306, 308, 310 and 312 may be coupled to the gate of the NMOS transistor 326. The sources of the plurality of NMOS transistors 302, 304, 306, 308, 310 and 312 may be coupled to the ground GND. The drains of the plurality of NMOS transistors 302, 304, 306, 308, 310 and 312 may output a plurality of output signals OP3_2, OP2_2, OP1_2, OP3_1, OP2_1 and OP1_1 respectively to the I component mixer circuits 206 and 212. Similarly, the gates of the plurality of NMOS transistors 314, 316, 318, 320, 322 and 324 may be coupled to the gate of the NMOS transistor 328. The sources of the plurality of NMOS transistors 314, 316, 318, 320, 322 and 324 may be coupled to the ground GND. The drains of the plurality of NMOS transistors 314, 316, 318, 320, 322 and 324 may output a plurality of output signals ON1_1, ON2_1, ON3_1, ON12, ON2_2 and ON3_2 respectively to the I component mixer circuits 206 and 212. The sources of the NMOS transistors 326, 328, 330 and 332 may be coupled to the ground GND.

The drains of the NMOS transistors 326 and 328 may be coupled to the sources of the NMOS transistors 334 and 336 respectively. The gates of the NMOS transistors 334 and 336 may be adapted to receive the differential input signals of the I channel, ip and in respectively. The sources of the NMOS transistors 334 and 336 may be coupled to the drains of the NMOS transistors 326 and 328 respectively. The drains of the NMOS transistors 334 and 336 may be coupled to the drains of the PMOS transistors 344 and 346 respectively. The gates of the PMOS transistors 344 and 346 may be coupled to each other. The drains of the PMOS transistors 344 and 346 may be coupled to the drains of the NMOS transistors 334 and 336 respectively. The sources of the PMOS transistors 344, 346, 342 and 348 may be coupled to a supply voltage Vdd. Resistor R1 may be in series with resistor R2 and may be coupled to the drains of the NMOS transistors 326 and 328.

The gates of the PMOS transistors 342 and 348 may be coupled to each other and to the gates of the PMOS transistors 344 and 346. The drains of the PMOS transistors 342 and 348 may be coupled to the sources of the PMOS transistors 338 and 340 respectively. The gates of the PMOS transistors 338 and 340 may be coupled to each other. The sources of the PMOS transistors 338 and 340 may be coupled to the sources of the NMOS transistors 342 and 348 respectively. The sources of the NMOS transistors 338 and 340 may be coupled to the drains of the NMOS transistors 330 and 332 respectively. The gates of the NMOS transistors 330 and 332 may receive a bias voltage $V_{bias}$. The drains of the NMOS transistors 330 and 332 may be coupled to the drains of the PMOS transistors 338 and 340 respectively.

While the I component Gm stage 202 as described in FIG. 3 comprises NMOS transistors and is implemented utilizing a single differential amplifier stage, the invention may not be so limited. Accordingly, the I component Gm stage 202 may also comprise NMOS, PMOS and/or BJT devices and may also be implemented utilizing a plurality of differential amplifier stages.

In operation, the NMOS transistors 334 and 336 may be adapted to receive the differential input signals of the I channel from the amplifier 128 [FIG. 1b]. The differential input signals may be converted to current by the resistors R1 and R2. The NMOS transistor 326 may be configured to mirror current to the plurality of NMOS transistors 302, 304, 306, 308, 310 and 312. The current passing from resistors R1 380 and R2 382 to the drain of the NMOS transistor 326 may be mirrored to each of the NMOS transistors 302, 304, 306, 308, 310 and 312. Similarly, the NMOS transistor 328 may behave as a current mirror to the plurality of NMOS transistors 314, 316, 318, 320, 322 and 324.

Current from resistors R1 380 and R2 382 to the drain of the NMOS transistor 328 may be mirrored to each of the NMOS transistors 314, 316, 318, 320, 322 and 324. The drains of the plurality of NMOS transistors 302, 304, 306, 308, 310 and 312 may output a plurality of output signals OP3_2, OP2_2, OP1_2, OP3_1, OP2_1 and OP1_1 respectively. The drains of the plurality of NMOS transistors 314, 316, 318, 320, 322 and 324 may output a plurality of output signals ON1_1, ON2_1, ON3_1, ON1_2, ON2_2 and ON3_2 respectively. The differential pairs of output signals OP1_1 and ON1_1, OP2_1 and ON2_1, OP3_1 and ON3_1 may be received by the I component mixer circuit 206. Similarly, the differential pairs of output signals OP1_2 and ON1_2, OP2_2 and ON2_2, OP3_2 and ON3_2 may be received by the I component mixer circuit 212. Similarly, the Q component Gm stage 204 may comprise suitable logic and/or circuitry that may be adapted to generate a plurality of differential pairs of output signals, for example, six differential pairs of output signals to the Q component mixer circuits 208 and 210 respectively.

Current passing from the source of the NMOS transistor 336 to the drain of the NMOS transistor 328 may be mirrored to each of the NMOS transistors 314, 316, 318, 308, 320 and 322. The drains of the plurality of NMOS transistors 302, 304, 306, 308, 310 and 312 may output a plurality of output signals OP3_2, OP2_2, OP1_2, OP3_1, OP2_1 and OP1_1 respectively. The drains of the plurality of NMOS transistors 314, 316, 318, 308, 320 and 322 may output a plurality of output signals ON1_1, ON2_1, ON3_1, ON1_2, ON2_2 and ON3_2 respectively. The differential pairs of output signals OP1_1 and ON1_1, OP2_1 and ON2_1, OP3_1 and ON3_1 may be received by the I component mixer circuit 206. Similarly, the differential pairs of output signals OP1_2 and ON1_2, OP2_2 and ON2_2, OP3_2 and ON3_2 may be received by the I component mixer circuit 212. Similarly, the Q component gm stage 204 may comprise suitable logic and/or circuitry that may be adapted to generate a plurality of differential pairs of output signals, for example, six differential pairs of output signals to the Q component mixer circuits 208 and 210 respectively.

Referring to FIG. 2, the signal averaging block 224 may be adapted to receive baseband output signals hrm_iop and hrm_ion from the output of output drive buffer 220 (FIG. 2), and baseband output signals hrm_qop and hrm_qon from the output of output drive buffer 222 (FIG. 2). The signal averaging block 224 generates an output signal, hrm_avg which is an average of the voltage levels hrm_iop, hrm_ion, hrm_qop, and hrm_qon. The signal comparator 226 receives the output baseband signal from the signal averaging block 224, hrm_avg, and compares that signal with the external voltage reference level $V_{REF}$. The signal comparator 226 generates a difference signal between $V_{REF}$ and hrm_avg. The dc_err output signal from the signal comparator 226 is fed back as an input to the gates of NMOS transistors 330 and 332 in the gm stages of both the I channel and the Q channel. Based on the comparison done by the signal comparator 226, three scenarios are possible. Namely, the dc_err is greater than 0, the dc_err is less than 0, and the dc_err is equal to 0.

In instances where the dc_err is greater than 0, an output common mode DC level in the signal output from the output driver buffers 220 and 222 (FIG. 2) may be lower than those present in the IF signal originally received at the gm stages 202 and 204 (FIG. 2). In response, bias levels in the system may be increased in order to compensate for the fact that output common mode DC levels are being introduced during the IF to baseband downconversion. A high voltage may be applied to the gates of NMOS transistors 330 and 332 in the gm stages in both the I channel and the Q channel. These gate signals are references as "bias" in FIG. 3. The high voltage applied to the bias signals may cause NMOS transistors 330 and 332 to conduct current. Since the drain of NMOS transistor 330 is tied to the gates of the current mirror circuit, which comprises NMOS transistors 302, 304, 306, 308, 310, 312, and 326, the current drawn by NMOS transistor 330 causes a reduction in the gate to source voltages of NMOS transistors 302, 304, 306, 308, 310, 312, and 326. Since the current through an NMOS transistor is dependent upon its gate to source voltage $V_{gs}$, the NMOS transistor 330 operates so as to cause a reduction of current being carried in the current mirror. A somewhat similar operation occurs between NMOS transistor 332 (FIG. 3) and the current mirror, which comprises NMOS transistors 314, 316, 318, 320, 322, 324, and 328.

At the load impedance networks 218 and 220 (FIG. 2), a reduction in current means that the voltage drop across the impedance network is lower. Using the exemplary load impedance network illustrated in FIG. 2A, the DC bias voltage at iop, which is equal to $V_{DD}-(R_{121} \times I_{SC}/2)$, and the DC bias voltage at ion, which is equal to $V_{DD}-(R_{123} \times I_{SC}/2)$, where $I_{SC}$ is the supply current, are each higher as a result of a reduction in the current through the current mirror. Using the exemplary load impedance network illustrated in FIG. 2A, the DC bias voltage at qop, which is equal to $V_{DD}-(R_{127} \times I_{SC}/2)$, and the DC bias voltage at qon, which is equal to $V_{DD}-(R_{125} \times I_{SC}/2)$, are each higher as a result of a reduction in the current through the current mirror.

In instances where the where dc_err is less than 0, output common mode DC level in the signal output from the output driver buffers 220 and 222 (FIG. 2) may be higher than those in the IF signal originally received at the gm stages 202 and 204 (FIG. 2). In response, bias levels in the system may be decreased to compensate for the fact that higher output common mode DC levels are being introduced during IF to baseband downconversion A low voltage may be applied to the gates of NMOS transistors 330 and 332 in the gm stages in both the I channel and the Q channel. These gate signals are labeled "bias" in FIG. 3. The low voltage applied to the "bias" signals may cause the NMOS transistors 330 and 332 to enter the OFF state and to stop conducting current, which may allow the voltage at the drain to rise. Since the drain of NMOS transistor 330 is tied to the gates of the current mirror circuit, which comprises NMOS transistors 302, 304, 306, 308, 310, 312, and 326, turning OFF the NMOS transistor 330 produces an increase in the gate to source voltage $V_{gs}$ of the NMOS transistors 302, 304, 306, 308, 310, 312, and 326. Since the current through an NMOS transistor is dependent upon the gate to source voltage, the action of NMOS transistor 330 results in an increase in the amount of current being carried in the current mirror. A somewhat similar operation occurs with NMOS transistor 332 (FIG. 3) and the current mirror comprises NMOS transistors 314, 316, 318, 320, 322, 324, and 328. At the load impedance networks 218 and 220 (FIG. 2), an increase in current means that the voltage drops across the impedance network is higher. Based on the exemplary load impedance network shown in FIG. 2A, the DC bias voltage at iop, which is equal to $V_{DD}-(R_{121}\times I_{SC}/2)$, and the DC bias voltage at ion, which is equal to $V_{DD}-(R_{123}\times I_{SC}/2)$ where $I_{SC}$ is the supply current level, are each lower as a result of an increase in the current through the current mirror. Based on the exemplary load impedance network shown in FIG. 2A, the DC bias voltage at qop, which is equal to $V_{DD}-(R_{127}\times I_{SC}/2)$, and the DC bias voltage at qon, which is equal to $V_{DD}-(R_{125}\times I_{SC}/2)$, are each lower as a result of an increase in the current through the current mirror.

In instances where the where dc_err is equal to 0, the DC offset voltage in the baseband signal output from the output driver buffers 220 and 222 (FIG. 2) may be equal to the reference voltage level. Accordingly, no DC offset level error has been detected as having been introduced into the received IF signal originally received at the gm stages 202 and 204 (FIG. 2). In response, the present bias levels in the system may be maintained. In this case NMOS transistors 330 and 332 stays in their current state so as to maintain the output common mode DC level.

Figure 4:
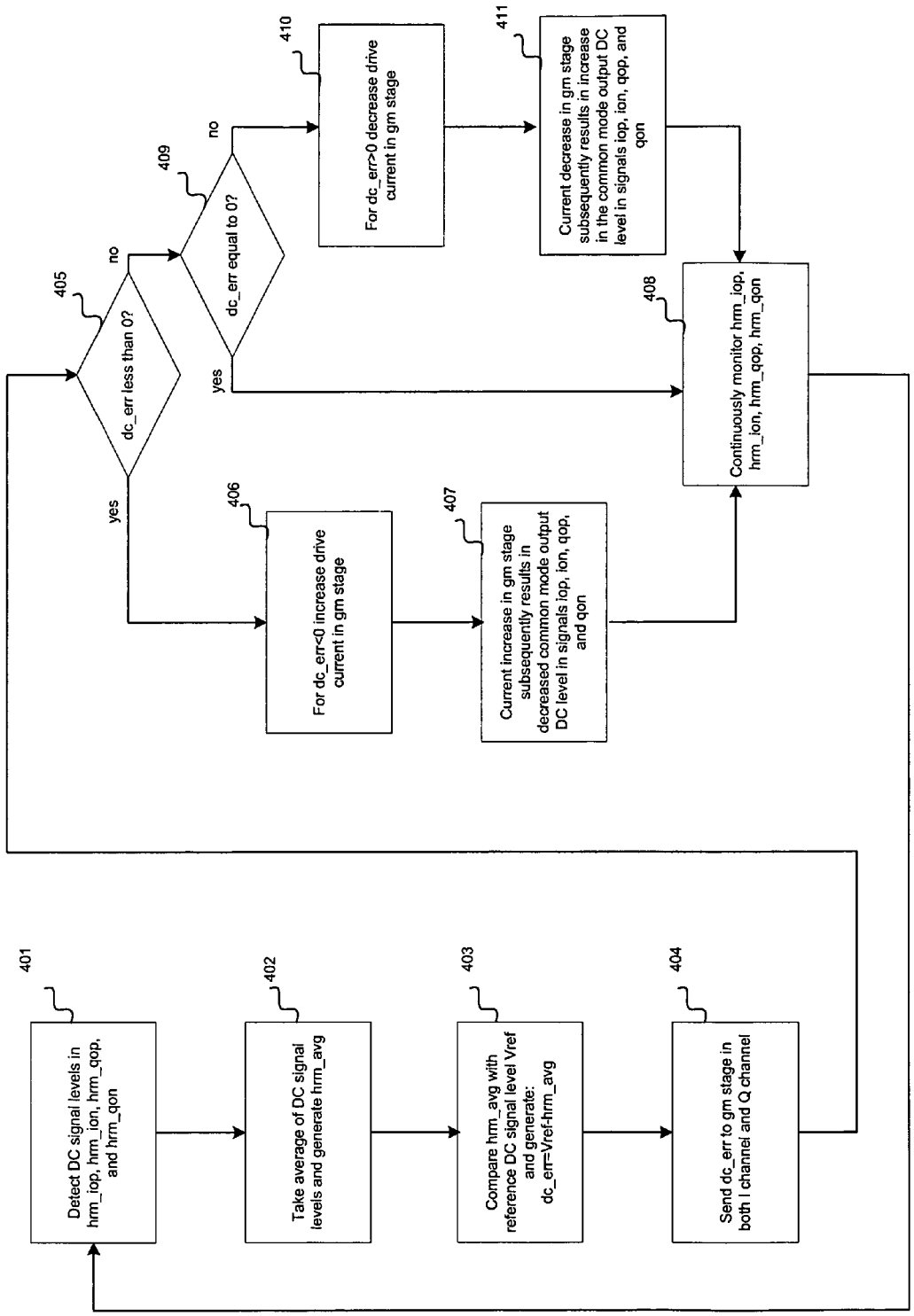
FIG. 4 is a flowchart illustrating exemplary steps that may be utilized to correct DC offset errors which have been introduced by the system into the received IF signal.

FIG. 4 is a flowchart illustrating exemplary steps that may be utilized to correct DC offset errors which have been introduced by the system into the received IF signal. Referring to FIG. 4, in step 401 the process begins by detecting DC signal levels on system outputs. In step 402, the output signal levels are averaged to produce an output common mode DC level. In step 403, the average is compared with the reference voltage and a signal, whose value is equal to the voltage error, is produced. In step 404, this error signal is sent to NMOS transistors 330 and 332 in the gm stages of the I channels and Q channel. Step 405 is a decision branch where the determination is made whether the error is greater than or less than 0. Step 406 is followed next if it is determined that the DC offset error is less than 0. In this step the drive current at the gm stage is increased. Next, in step 407, we determine that the increase in current at the gm stage has increased the common mode output DC level. In step 408 monitoring of DC signal levels on system outputs continues, and a return to step 401 is made. If it is determined at step 405 that the DC offset error is greater than 0, then step 409 follows Step 405. Step 409 is another decision branch where the determination is made as to whether the DC offset error is equal to 0 or greater than 0. If the DC offset error is equal to 0 then step 408 follows step 409, which is again followed by a return to step 401. If the DC offset error is greater than 0, then step 410 follows step 409 and the drive current at the gm stage is decreased. In step 411 it may be determined that the decrease in current at the gm stage has decreased the DC offset error at the outputs. Step 408 follows next, followed once again by step 401.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for reducing DC offset in a receiver, the method comprising:
   averaging signals to determine an output common mode DC offset level, said signals being generated from an output of a mixer;
   determining an average of said signals having said common mode DC offset level;
   comparing said determined average to a reference voltage;
   correcting said common mode DC offset level at an input of said mixer for signals which are subsequently generated from an output of said mixer utilizing results from said comparing; and
   feeding back said corrected common mode DC offset level to an input of said mixer.

2. The method according to claim 1, comprising generating a corrected DC error signal from said comparing, wherein said results from said comparing comprises said corrected DC error signal.

3. The method according to claim 1, comprising communicating a corrected DC error signal to at least one gm stage of said mixer.

4. The method according to claim 1, comprising communicating a corrected DC error signal to an I component path and Q component path of at least one gm stage of said mixer.

5. The method according to claim 1, wherein said average is determined for differential outputs of said mixer.

6. The method according to claim 1, comprising controlling a current source at a gm stage of said mixer utilizing at least an error signal from said comparing.

7. The method according to claim 6, comprising correcting an output common mode DC voltage at an output of said mixer by said controlling of said current source.

8. The method according to claim 1, comprising continuously monitoring output signals generated from said output of said mixer and correcting said signals having said common mode DC offset level, which are generated from said an output of said mixer.

9. A system for reducing DC offset in a receiver, the system comprising:
   one or more circuits that enable averaging of signals to determine an output common mode DC offset level, said signals being generated from an output of a mixer;
   said one or more circuits enable determination of an average of said signals having said common mode DC offset level;
   said one or more circuits enable comparison of said determined average to a reference voltage; and said one or more circuits enable correction of said common mode DC offset level at an input of said mixer for signals which are subsequently generated from an output of said mixer utilizing results from said comparing,
wherein said one or more circuits enable feedback of said corrected common mode DC offset level to an input of said mixer.

10. The system according to claim 9, wherein said one or more circuits enable generation of a corrected DC error signal from said comparing, wherein said results from said comparing comprises said corrected DC error signal.

11. The system according to claim 9, wherein said one or more circuits enable communication of a corrected DC error signal to at least one gm stage of said mixer.

12. The system according to claim 9, wherein said one or more circuits enable communication of a corrected DC error signal to an I component path and Q component path of at least one gm stage of said mixer.

13. The system according to claim 9, wherein said average is determined for differential outputs of said mixer.

14. The system according to claim 9, comprising circuitry that controls wherein said one or more circuits enable control of a current source at a gm stage of said mixer utilizing at least an error signal from said comparing.

15. The system according to claim 14, comprising wherein said one or more circuits enable correction of an output common mode DC voltage at an output of said mixer by said controlling of said current source.

16. The system according to claim 9, wherein said one or more circuits enable continuous monitoring of output signals generated from said output of said mixer and correcting said signals having said common mode DC offset level, which are generated from said an output of said mixer.

* * * * *